United States Patent
Chen et al.

(10) Patent No.: US 7,639,474 B1
(45) Date of Patent: Dec. 29, 2009

(54) MULTI-SEGMENT PARALLEL WIRE CAPACITOR

(75) Inventors: Shuxian Chen, Fremont, CA (US); Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/336,182

(22) Filed: Dec. 16, 2008

Related U.S. Application Data

(62) Division of application No. 11/166,733, filed on Jun. 23, 2005, now Pat. No. 7,471,500.

(51) Int. Cl.
*H01G 4/228* (2006.01)

(52) U.S. Cl. ............ 361/306.1; 361/306.2; 361/301.4; 361/321.2; 361/311; 361/313; 438/240; 438/395; 438/396

(58) Field of Classification Search ............ 361/306.1, 361/311–313, 306.3, 301.4, 302–305, 321.1, 361/321.2; 438/395–396, 128, 240
See application file for complete search history.

(56) References Cited

U.S. PATENT DOCUMENTS

| | | | | |
|---|---|---|---|---|
| 6,300,682 B2* | 10/2001 | Chen | ................. | 257/758 |
| 6,387,775 B1* | 5/2002 | Jang et al. | ................. | 438/396 |
| 6,919,233 B2* | 7/2005 | Papa Rao et al. | ................. | 438/128 |
| 7,327,011 B2* | 2/2008 | Hudson et al. | ................. | 257/534 |

* cited by examiner

*Primary Examiner*—Nguyen T Ha
(74) *Attorney, Agent, or Firm*—Ward & Olivo LLP

(57) ABSTRACT

A multi-segment parallel wire capacitor includes substantially identical multiple capacitor segments fabricated on a semiconductor substrate. Each segment comprises at least first and second interleaved metal finger formed in a first metal layer above the substrate and third and fourth interleaved metal fingers formed in a second metal layer. The first and fourth sets are connected together to form one plate of the capacitor and the second and third sets are connected to form a second plate. The multiple capacitor segments are arranged in a matrix having M rows and N columns. The multiple capacitor segments are inter-connected in such a manner that the capacitor segments in each column of the matrix are connected in parallel. First and second metal lines selectively connect the plates of the different capacitor segments in the first and last rows and serve as the two opposite terminals of the multi-segment parallel wire capacitor.

15 Claims, 6 Drawing Sheets

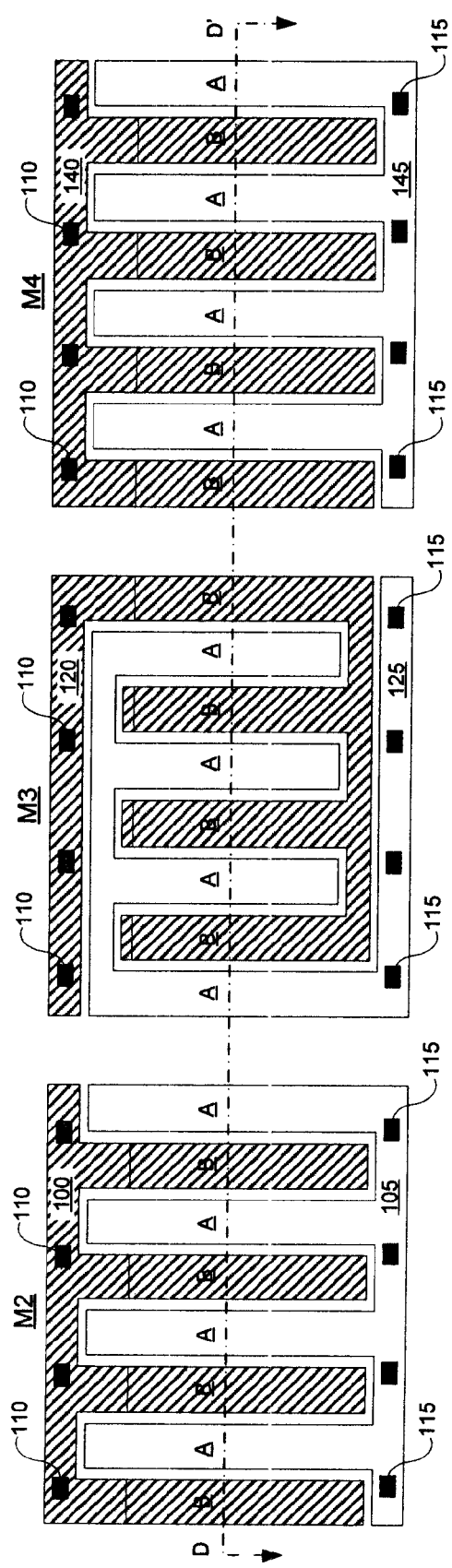

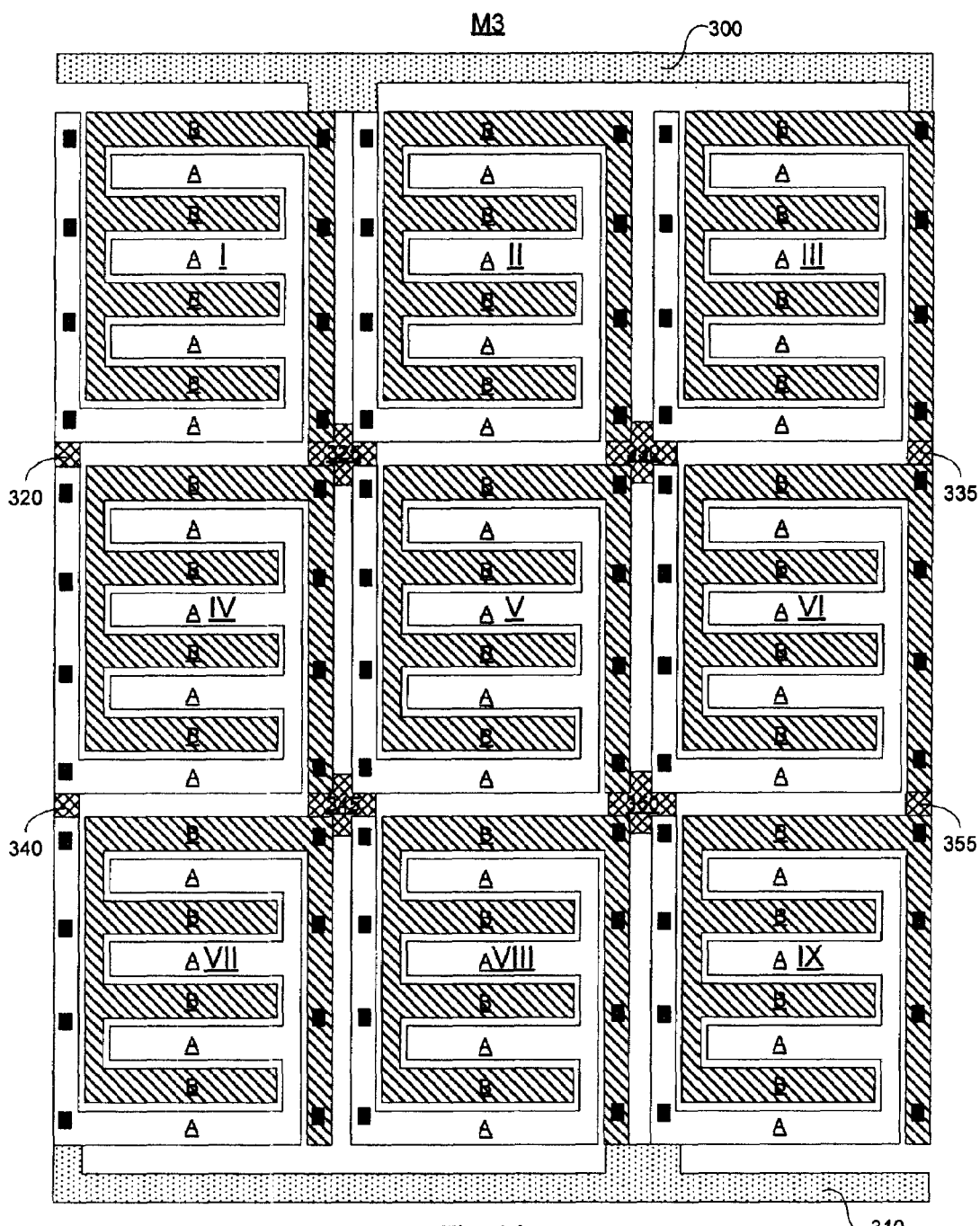
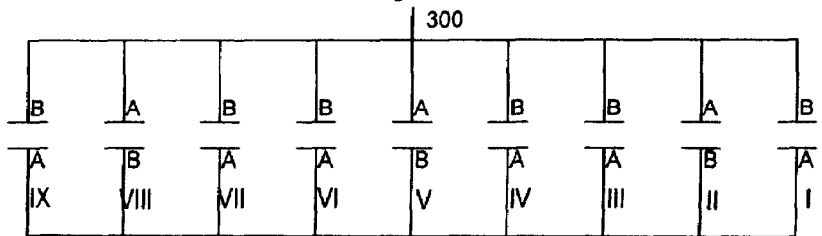
Fig. 3A
Fig. 3B

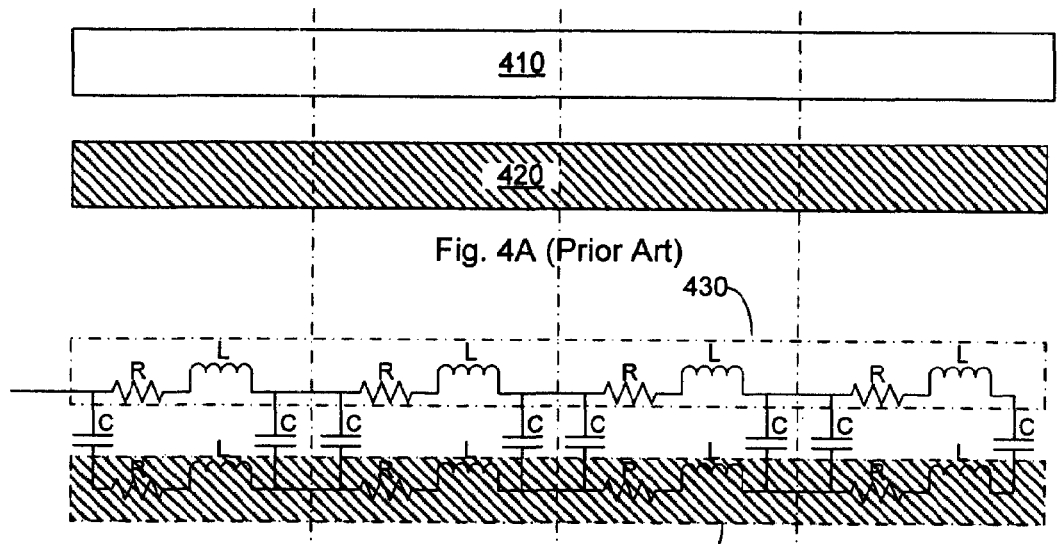
Fig. 4A (Prior Art)
Fig. 4B (Prior Art)
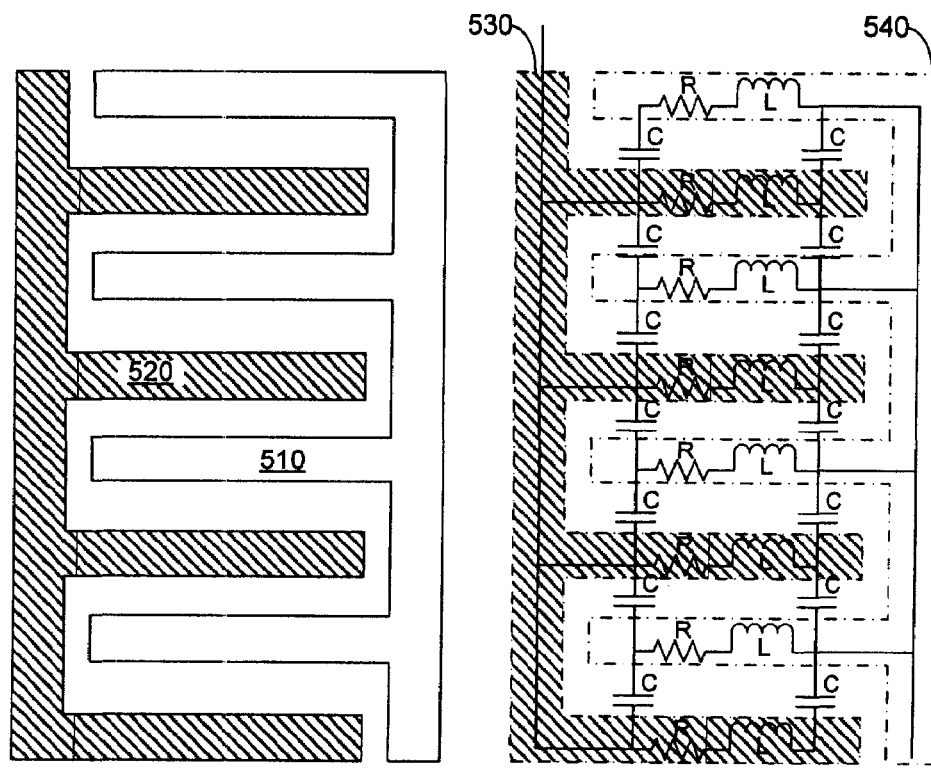
Fig. 5A  Fig. 5B

M2 (or M4)

MULTI-SEGMENT PARALLEL WIRE CAPACITOR

CROSS-REFERENCE TO RELATED APPLICATION

The present application is a divisional of application Ser. No. 11/166,733, filed Jun. 23, 2005, now U.S. Pat. No. 7,471,500B1.

FIELD OF THE INVENTION

The present invention relates generally to the field of integrated circuit (IC) design and manufacture, and in particular, to a multi-segment parallel wire capacitor structure fabricated on a semiconductor substrate.

BACKGROUND

High-capacitance, on-chip capacitors are widely used in various types of digital and analog ICs such as dynamic random access memory (DRAM) and phase-lock loop (PLL), etc. Traditionally, such a capacitor is comprised of two sets of parallel metal wires embedded in different dielectric layers above a semiconductor substrate. The two sets of metal wires are alternately connected to the two opposite terminals of the capacitor. The capacitance of the capacitor is a function of the number of metal wires connected to one terminal, their respective length, width, and distance to neighboring metal wires connected to the other terminal. For example, a capacitor having longer metal wires usually has a higher capacitance providing that other geometric parameters remain the same.

Several shortcomings have been attributed to the aforementioned design of a capacitor structure. First, it is not flexible. Each specific design is associated with a fixed capacitance. If an IC requires a capacitance different from a previous design, a circuit designer has to compute a different set of geometric parameters for the corresponding capacitor structure. As a result, the IC manufacturing process has to be adjusted accordingly to fabricate the new capacitor structure. If an IC needs multiple on-chip capacitors, each having a unique capacitance, this may significantly increase the IC's design and manufacturing cost. Second, even though a longer metal wire may correspond to a higher capacitance, it is often accompanied by serious side effects. For example, a capacitor including longer metal wires tends to have higher parasitic resistance and inductance. This reduces the efficiency of the capacitor especially at higher frequencies.

In view of the aforementioned issues, there is a need for an on-chip capacitor structure that is easily adjustable to satisfy different capacitance requirements. It is also desirable that the capacitor structure have a better performance than conventional on-chip capacitors especially at high operating frequencies.

SUMMARY

In a preferred embodiment of the present invention, a capacitor matrix includes M×N substantially identical capacitor segments fabricated on a semiconductor substrate. Each segment preferably comprises at least first and second sets of interleaved metal fingers formed on a first metal layer above the substrate and third and fourth sets of interleaved metal fingers formed on a second metal layer above the first metal layer. The metal fingers of the third and fourth sets preferably are parallel to and directly above the metal fingers of the first and second sets, respectively. The first and fourth sets are electrically connected together and they constitute one plate or terminal of the capacitor segment; and the second and third sets are electrically connected together and they serve as a second plate or terminal of the capacitor segment.

From a top view, the M×N capacitor segments are arranged in a matrix having M rows and N columns. M and N may or may not be the same. The M×N capacitor segments are interconnected in such a manner that the plates of the capacitor segments in each column are connected in parallel. The plates of different columns of the capacitor segments are selectively connected to a first metal line and a second metal line, that serve as the two opposite terminals of the capacitor matrix. As a result, the capacitor matrix has a capacitance that is substantially the sum of the capacitance of each individual capacitor segment.

BRIEF DESCRIPTION OF THE DRAWINGS

The aforementioned aspects of the invention as well as additional aspects will be more clearly understood as a result of the following detailed description of the various embodiments of the invention when taken in conjunction with the drawings. Like reference numerals refer to corresponding parts throughout the several views of the drawings.

FIGS. 1A-1D are three top views and one cross-sectional views illustrating structures of a capacitor segment within different dielectric layers in accordance with some embodiments of the present invention.

FIG. 3A is a top view of structures of a 3×3 multi-segment parallel wire capacitor matrix within a dielectric layer in accordance with some embodiments of the present invention.

FIG. 3B is a schematic diagram illustrating the equivalent circuit of the 3×3 multi-segment parallel wire capacitor matrix.

FIGS. 4A and 4B are diagrams illustrating a prior art capacitor and its equivalent electrical circuit.

FIGS. 5A and 5B are diagrams illustrating a capacitor and its equivalent electrical circuit in accordance with some embodiments of the present invention.

DESCRIPTION OF EMBODIMENTS

Figure 1E:
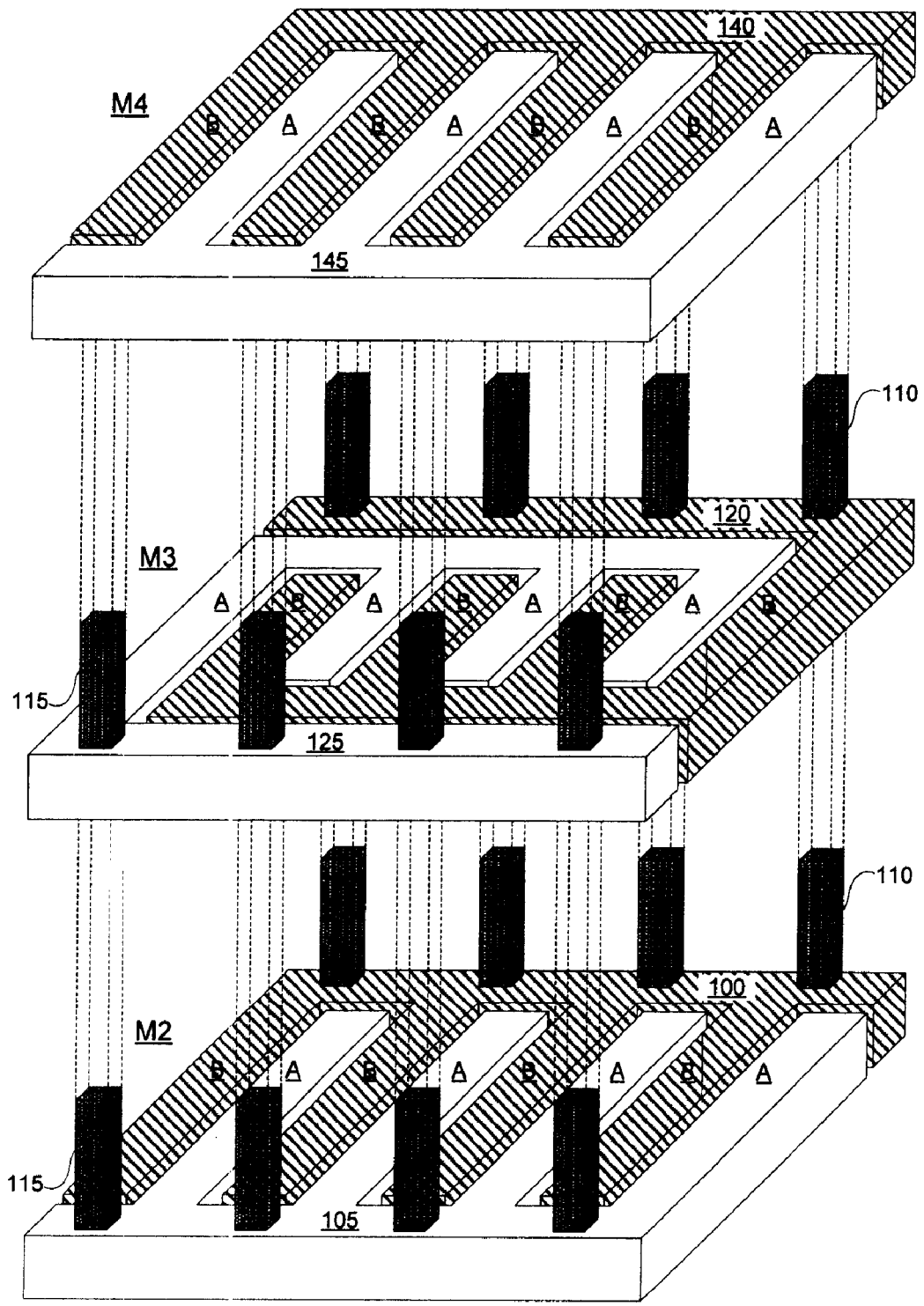
FIG. 1E is a 3-D isometric view of the capacitor segment in accordance with some embodiments of the present invention.

Problems associated with the conventional on-chip capacitor structure, as mentioned above in the background section, can be solved or at least substantially avoided by fragmentizing a single, large (relative to the chip size), on-chip capacitor structure into many small segments. Each segment by itself is a capacitor having its own pair of terminals and a specific capacitance. Through appropriate inter-segment connections, multiple segments are connected together to form an on-chip capacitor having a larger capacitance.

In some embodiments, the larger capacitor has a capacitance that is substantially the sum of the capacitance of each individual segment. Therefore, given a specific capacitance requirement, a circuit designer can easily determine the number of segments needed to meet the requirement and then choose an appropriate connection scheme to connect them together. In the event that an IC needs multiple on-chip capacitors of different capacitances, the circuit designer does not have to re-compute a specific set of geometric parameters for each individual capacitor. Instead, the same design strategy discussed above is applicable to any of them.

FIGS. 1A, 1B, and 1C are three schematic top views illustrating the structures of a capacitor segment within three adjacent dielectric layers in accordance with some embodiments of the present invention.

FIG. 1A depicts the structure of a portion of the capacitor segment in the second metal layer M2, which is hereinafter referred to as a "capacitor element." The capacitor element includes two sets of interleaved parallel metal wire fingers, one set being labeled "B" and the other set being labeled "A." A metal line 100 connects one end of each B finger together, serving as one terminal of the capacitor element. Another metal line 105 connects one end of each A finger together, serving as the other terminal of the capacitor element. The dark rectangle boxes 110 and 115 on the two metal lines 100 and 105 represent metal vias that connect this capacitor element to one or more capacitor elements that are part of the same capacitor segment, but in a different metal layer(s).

FIG. 1B depicts the structure of a capacitor element in the third metal layer M3. Like the capacitor element in FIG. 1A, this capacitor element includes two metal lines 120 and 125 that are alternately connected to two sets of interleaved metal wire fingers A and B. The capacitor element is electrically connected to one or more other elements in other metal layers that are part of the same capacitor segment through metal vias 110 and 115. Note that the spatial sequence of metal wire fingers in FIG. 1B is different from that shown in FIG. 1A. For example, the leftmost finger in FIG. 1B is an A finger while the same position in FIG. 1A is occupied by a B finger.

FIG. 1C depicts the structure of a capacitor element in the fourth metal layer M4, which has substantially the same structure as the one in FIG. 1A. A metal line 140 connects one end of each B finger together serving as one terminal of the capacitor element; and a metal line 145 connects one end of each A finger together, serving as the other terminal of the capacitor element. This capacitor element is electrically connected to one or more other elements that are part of the same capacitor segment by metal vias 110 and 115.

FIG. 1D is a cross-sectional view of the capacitor segment along line D-D'. Five dielectric layers D1 to D5 are stacked together on top of a semiconductor substrate. Within layers D2, D3 and D4 and separated from one another by the dielectric material are metal fingers A and B. The fingers in the different layers are directly above the fingers in the layer below them and run parallel to them. As shown in FIG. 1D, the spatial sequence of metal wire fingers in metal layer M3 is different from that in metal layers M2 and M4. The sequence in layer M3 begins on the left hand side with an A finger while the sequences in layers M2 and M4 begin with a B finger. As a result, the fingers adjacent to or nearest to an A finger are all B fingers and vice versa. Specifically, each A (or B) finger in metal layer M3 is surrounded by three or four B (or A) fingers located in metal layers M2, M3, and M4. Similarly, each A (or B) finger in metal layer M2 (or M4) is surrounded by two or three B (or A) fingers located in metal layers M2 (or M4) and M3. This arrangement increases the surface area of the two opposite terminals of the capacitor segment and therefore increases the capacitance of the capacitor segment.

For illustrative purposes, this capacitor segment includes three capacitor elements. However, it will be understood by one skilled in the art that the capacitor segment may have more than three capacitor elements or as few as only two capacitor segments. Advantageously, there are no capacitor elements or other metal lines or dummy metal fills directly below the capacitor element in layer M2 or directly above the capacitor element in layer M4. This configuration reduces parasitic capacitance between the capacitor segment and its surrounding environment. Although not show in FIG. 1D, it will be apparent to one skilled in the art that, during the fabrication of the metal layers, metal vias are also fabricated at designated locations in the dielectric layers. These metal vias, as shown in FIG. 1E, connect the metal fingers in the dielectric layers in accordance with a predefined scheme to form a capacitor segment.

FIG. 1E is a 3-D isometric view of the capacitor segment. The metal lines connected to the interleaved metal wire fingers of the three capacitor elements are connected together through metal vias 110 and 115. As a result, the B halves of all the interleaved metal wire fingers are connected in parallel to the metal lines 100, 120, and 140 and the A halves of the interleaved metal wire fingers are connected to the metal lines 105, 125, and 145. These two halves serve as the two opposite plates or terminals of the capacitor segment. The two opposite plates are electrically insulated from each other by dielectric material as shown in FIG. 1D. In some embodiments, the capacitor segment has a capacitance ranging from 50 fF to 70 fF depending on the geometric dimensions and material composition of the capacitor segment.

As mentioned above, one advantage of having many capacitor segments instead of a single large on-chip capacitor is that they may be connected together to form a capacitor having a predetermined larger capacitance. Two embodiments of multi-segment parallel wire capacitors are disclosed in FIGS. 2A-b and 3A-B, respectively. For illustrative purposes, only top views of the multi-segment parallel capacitors are provided below.

Figure 2A:
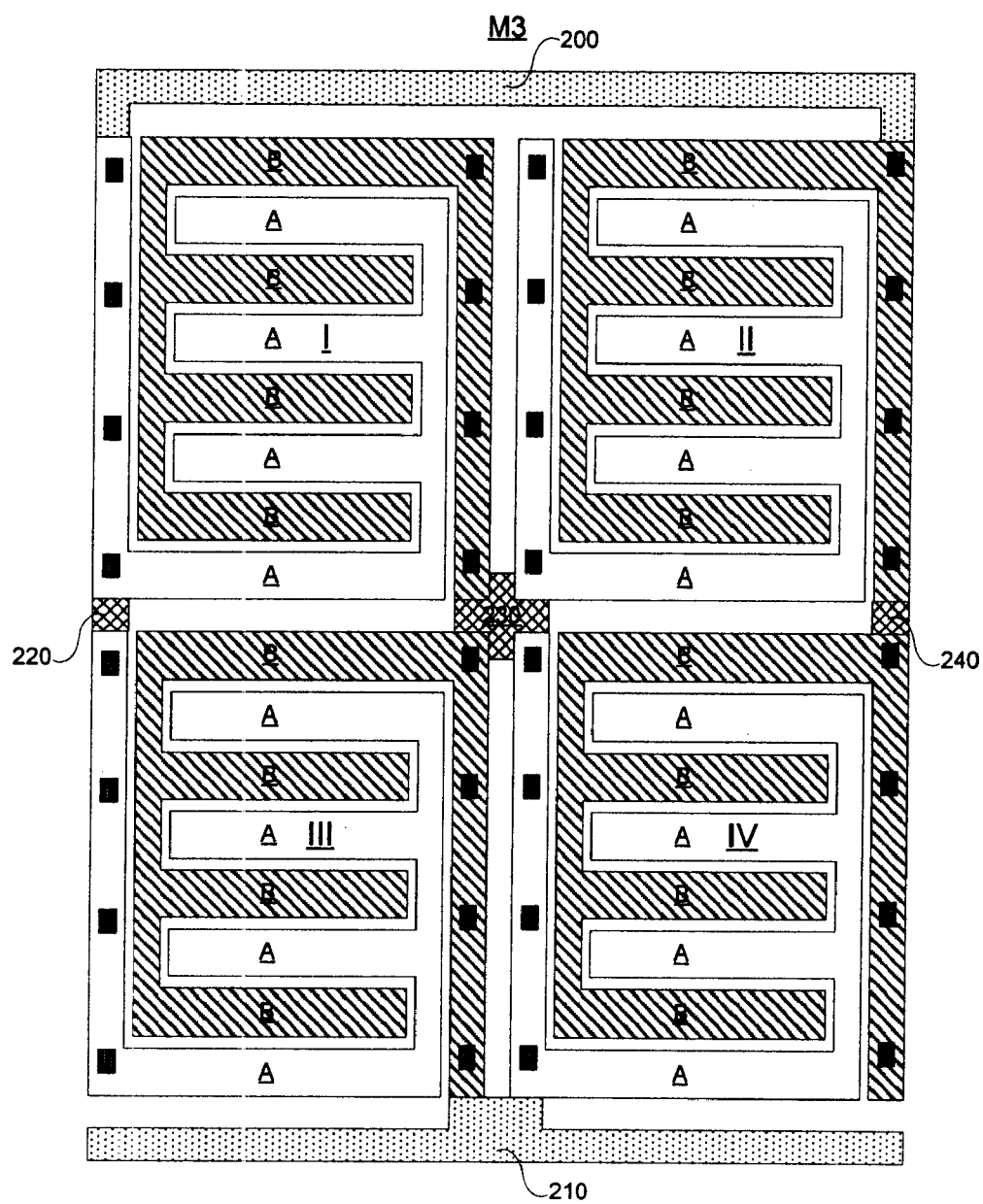
FIG. 2A is a top view of structures of a 2×2 multi-segment parallel wire capacitor matrix within a dielectric layer in accordance with some embodiments of the present invention.

FIG. 2A is a top view illustrating the structures in metal layer M3 of a 2×2 multi-segment parallel wire capacitor matrix having segments I-IV. Each of the four capacitor segments I-IV has two sets of interleaved fingers A and B; and as shown in FIGS. 1A-1E the fingers of each set are connected by metal vias 110 and 115 to other interleaved fingers in at least one additional metal layer. The two sets of fingers of each segment serve as opposite plates or terminals A and B of the capacitor segment. The segments are electrically insulated from one another by the surrounding dielectric material except where interconnects are made. In this particular example, plate A of capacitor segment I is connected in parallel to plate A of capacitor segment III through metal interconnect 220, and plate B of capacitor segment II is connected in parallel to plate B of capacitor segment IV through metal interconnect 240. A metal line 200 connects plate A of capacitor segment I to plate B of capacitor segment II, serving as one terminal of the 2×2 capacitor matrix. Plate B of capacitor segment I is connected in parallel to plate B of capacitor segment III, plate A of capacitor segment II, and plate A of capacitor segment IV through interconnect 230. Another metal line 210 is connected to plate B of capacitor segment III and plate A of capacitor segment IV, serving as the other terminal of the 2×2 capacitor matrix. Advantageously, metal interconnects 220, 230, 240 and metal lines 210 are physically part of metal layer M3 and are formed at the same time as fingers A and B of metal layer M3.

Figure 2B:
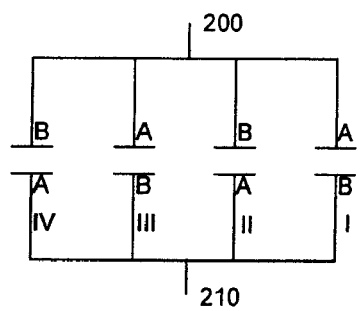
FIG. 2B is a schematic diagram illustrating the equivalent circuit of the 2×2 multi-segment parallel wire capacitor matrix.

FIG. 2B is a schematic diagram illustrating the equivalent circuit of the 2×2 capacitor matrix shown in FIG. 2A. Since the four individual capacitor segments are connected in parallel, the capacitance of the 2×2 multi-segment parallel wire capacitor $C_{2\times 2}$ is the sum of the capacitances of the four individual capacitor segments:

$$C_{2\times 2}=C_I+C_{II}+C_{III}+C_{IV}.$$

FIG. 3A is a top view illustrating the structure in metal layer M3 of a 3×3 multi-segment parallel wire capacitor matrix having segments I-IX. Each of the nine capacitor segments I-IX has two sets of interleaved fingers A and B; and, as shown in FIGS. 1A-1E, the fingers of each set are connected by metal vias 110 and 115 to other interleaved fingers in at least one additional layer. The two sets of fingers of each segment serve as opposite plates A and B of the capacitor segment. The plates of the nine capacitor segments are inter-connected in a manner similar to the connection scheme shown in FIG. 2A. Specifically, plates A of capacitor segments I, IV, and VII are connected in parallel by interconnects 320 and 340; and plates B of capacitor segments II, V and VIII are connected to plates A of capacitor segments III, VI and IX by connectors 330 and 350. At one end of the 3×3 capacitor matrix, a metal line 300 connects plate B of capacitor segment I to plate A of capacitor segment II and plate B of capacitor segment III, serving as one terminal of the 3×3 multi-segment parallel wire capacitor. Plates B of capacitor segments I, IV and VII are connected to plates A of capacitor segments II, V and VIII by connectors 325 and 345; and plates B of capacitor segments III, VI and IX are connected by interconnects 335 and 345. Another metal line 310 connects plate A of capacitor segment VII to plate B of capacitor segment VIII and plate A of capacitor segment IX, serving as the other terminal of the 3×3 capacitor matrix. Again, the metal interconnects and metal lines are physically part of metal layer M3 and are formed at the same time as fingers A and B of metal layer M3.

FIG. 3B is a schematic diagram illustrating the equivalent circuit of the 3×3 multi-segment parallel wire capacitor shown in FIG. 3A. Since the nine individual capacitor segments are connected in parallel, the capacitance of the 3×3 multi-segment parallel wire capacitor $C_{3\times 3}$ is the sum of the capacitances of the nine individual capacitor segments:

$$C_{3\times 3}=C_I+C_{II}+\ldots+C_{IX}.$$

In either embodiment discussed above, if each member of the multi-segment parallel wire capacitor matrix has an identical predetermined capacitance, the capacitance of the multi-segment parallel wire capacitor is substantially the sum of the predetermined capacitance multiplied by the number of capacitor segments being connected in parallel together (4 or 9). However, it will be apparent to one skilled in the art that having all the capacitor segments connected in parallel is only for illustrative purposes and it is by no means the only option.

For instance, if the goal is to have a multi-segment parallel wire capacitor whose capacitance is not close to a multiple of a single capacitor segment, it may be necessary for the multi-segment parallel wire capacitor to include two or more serially connected capacitor segments. As an example, a multi-segment parallel wire capacitor whose capacitance is 4.5 times the capacitance of one segment may be composed of six capacitor segments, two of them being serially connected and then connected in parallel to the other four. Furthermore, one skilled in the art will appreciate that there may be other connection schemes that can produce the same targeted capacitance. Different schemes may be chosen depending on many design-related factors, e.g., the location of the multiple capacitor segments, or the electronic application using the multiple capacitor segments, etc.

The two embodiments illustrate how multiple capacitor segments are wired to create a capacitor having a desired capacitance. The flexibility in terms of wiring schemes is a significant improvement of the present invention over the conventional on-chip capacitor structure. Another advantage the present invention has over the conventional on-chip capacitor structure is that the Q factor of a multi-segment parallel wire capacitor according to the present invention is higher than that of the conventional on-chip capacitor structure. For illustrative purposes, the following discussion is limited to a capacitor element within a capacitor segment and its equivalent structure in a prior art on-chip capacitor.

FIG. 4A depicts two long metal wires 410 and 420 that are part of a prior art capacitor. FIG. 4B shows an equivalent circuit corresponding to the two long metal wires when the two wires operate in a high frequency domain. The equivalent circuit can be partitioned into two branches 430 and 440, each branch having four pairs of parasitic resistor R and parasitic inductor L and each pair corresponding to one section of the long metal wires 410 or 420 as shown in FIG. 4A. The two branches of the equivalent circuit are coupled to each other by multiple capacitors C. Since the parasitic resistors and parasitic inductors within each branch are serially connected, the electrical power wasted by the four pairs of parasitic resistor and parasitic inductor is approximately four times the electric power wasted by one pair of parasitic resistor and parasitic inductor.

FIG. 5A depicts a capacitor element according to some embodiments of the present invention. The capacitor element is composed of two opposite terminals 510 and 520, each terminal including four metal wire fingers. The four metal wire fingers associated with the two terminals 510 and 520 are alternately positioned in a metal layer. For purposes of comparison, the length, depth, and width of each metal wire finger is assumed to be about the same as that of a metal wire section shown in FIG. 4A. Therefore, the capacitances of the capacitor element shown in FIG. 5A and the prior art capacitor shown in FIG. 4A are about the same.

However, as shown in FIG. 5B, the equivalent circuit of the capacitor element shown in FIG. 5A is significantly different from that of the prior art capacitor in FIG. 4A. Unlike the capacitor shown in FIGS. 4A-4B, each metal wire finger connected to terminal 520 is surrounded by two metal wire fingers connected to terminal 510 and vice versa. The four pairs of parasitic resistors and parasitic inductors associated with each branch are not serially connected but are connected in parallel and each pair associated with one branch is electrically coupled to two pairs associated with the other branch. The parasitic resistance (or parasitic inductance) of one branch 520 is only about a quarter of the parasitic resistor R (or parasitic inductor L). Consequently, when the capacitor element operates in a high frequency domain, less electric power is wasted by the parasitic resistors and less inductive effect is presented in the capacitor element, which helps to improve the overall performance of a corresponding multi-segment capacitor matrix. In other words, the Q factor of the capacitor element shown in FIG. 5A is higher than that of the prior art capacitor shown in FIG. 4A.

While the invention has been described for the case where the plates of the capacitor segments in each column of the capacitor matrix are connected in parallel, the invention may also be practiced where the plates of the capacitor segment in each row of the matrix are connected in parallel and the two metal lines that serve as opposite terminals of the capacitor matrix are connected to the first and last columns of the matrix.

Figure 6A:
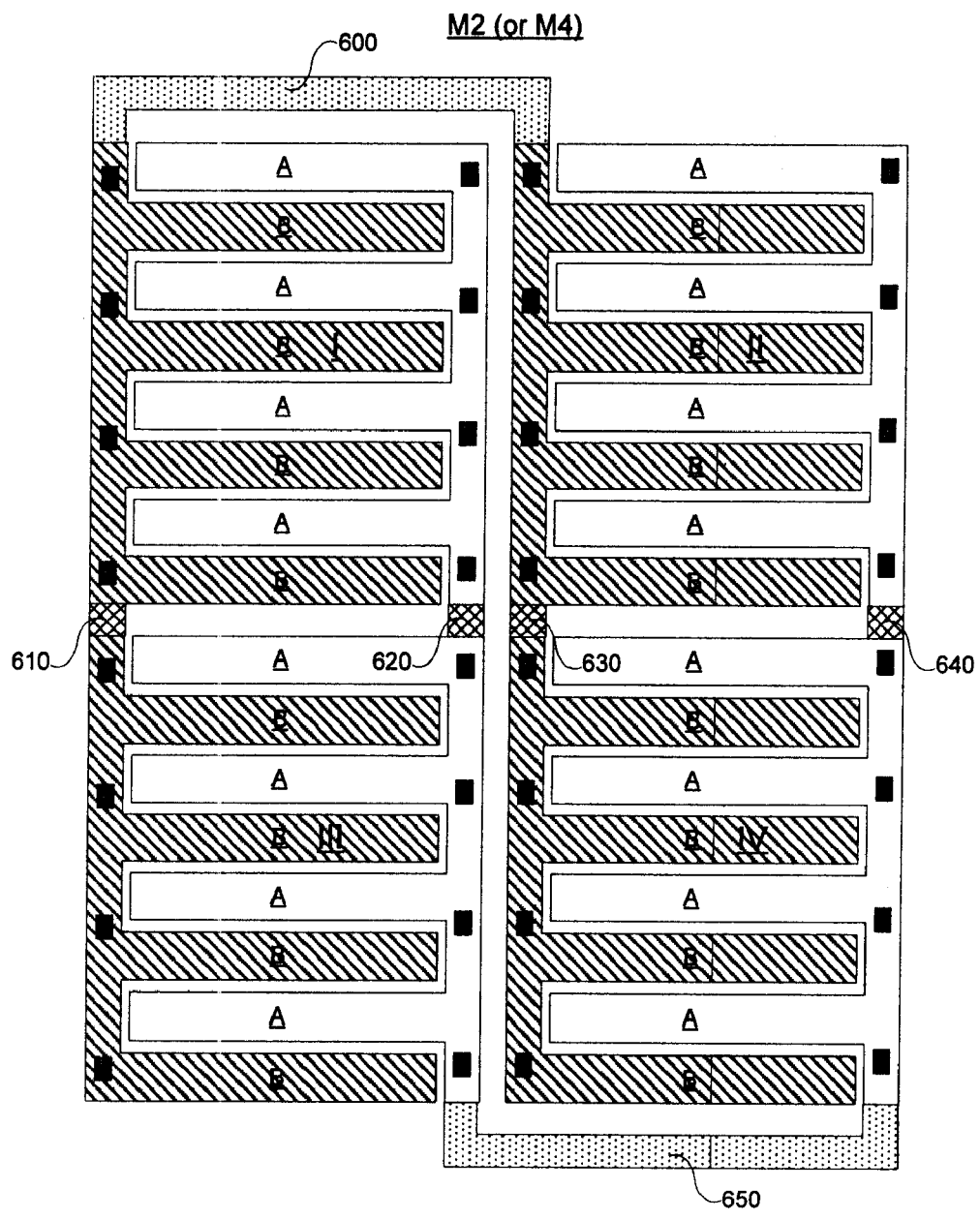
FIG. 6A is a top view of structures of another 2×2 multi-segment parallel wire capacitor matrix within a dielectric layer in accordance with some embodiments of the present invention.
Figure 6B:
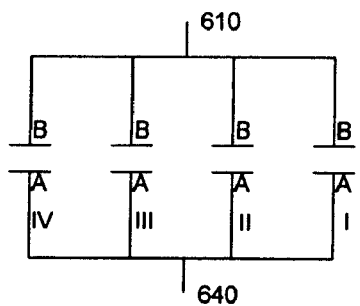
FIG. 6B is a schematic diagram illustrating the equivalent circuit of the 2×2 multi-segment parallel wire capacitor matrix.

FIGS. 6A and 6B illustrate a 2×2 multi-segment capacitor matrix in accordance with a different connection scheme. Unlike the 2×2 multi-segment capacitor matrix shown in FIG. 2A, the metal interconnects and metal lines connecting the four capacitor segments are all located in metal layer M2 (or M4). Specifically, plates B of the two capacitor elements I and II in the first row are connected in parallel by metal line 600 and plates A of the two capacitor elements III and IV in the second row are connected in parallel by metal line 650. Metal interconnects 610, 620, 630, and 640 connect two plates having the same label within each column in parallel. FIG. 6B depicts the equivalent circuit of the 2×2 capacitor matrix shown in FIG. 6A. Note that in this particular example, plates B of the four capacitor segments serve as one terminal of the capacitor matrix while plates A of the four capacitor segments serve as the other terminal of the capacitor matrix. Since the four individual capacitor segments are connected in parallel, the capacitance of the 2×2 multi-segment parallel wire capacitor is the sum of the capacitances of the four individual capacitor segments.

The foregoing description, for purpose of explanation, has been set forth with reference to specific embodiments. However, the illustrative discussions above are not intended to be exhaustive or limit the invention to the precise forms disclosed. Illustratively, all the metal interconnects and metal lines in the aforementioned embodiments are within the same metal layer. One skilled in the art will find that this requirement is optional and it is completely possible to have a connection scheme whose metal interconnects are located in multiple metal layers. Moreover, while the preferred embodiment of the invention locates the metal fingers of one layer directly above the metal fingers of a lower layer, the invention may also be practiced in situations where the fingers of one layer are offset from a position directly above the fingers of a lower layer. Still other variations will be obvious to one of ordinary skill in the art.

What is claimed is:

1. A multi-segment parallel wire capacitor fabricated on a semiconductor substrate, comprising:
    multiple banks of capacitor segments, the capacitor segments within each bank being connected in parallel and each capacitor segment having a predetermined capacitance;
    wherein the multiple banks of capacitor segments are connected in accordance with a predefined connection scheme; and
    wherein a first metal line is selectively connected to a capacitor segment within a first bank of capacitor segments and a second metal line is selectively connected to a capacitor segment within a second bank of capacitor segments.

2. The multi-segment parallel wire capacitor of claim 1, wherein
    each of the capacitor segments includes a first plate and a second plate;
    the first plates of the capacitor segments are connected in parallel by a first set of metal interconnects and metal vias;
    the second plates of the capacitor segments are connected in parallel by a second set of metal interconnects and metal vias; and
    the first metal line is connected to a first plate of at least one of the capacitor segments and the second metal line is connected to a second plate of at least one of the capacitor segments.

3. The multi-segment parallel wire capacitor of claim 1, wherein
    the multiple banks of capacitor segments are arranged in a matrix having M rows and N columns;
    the capacitor segment at row I and column J of the matrix is connected in parallel to the capacitor segments in that row (or column); and
    the first metal line is selectively connected to a first column (or row) of capacitor segments and the second metal line is selectively connected to a last column (or row) of capacitor segments.

4. The multi-segment parallel wire capacitor of claim 1, wherein the multi-segment parallel wire capacitor has a capacitance that is substantially a sum of the predetermined capacitances of the multiple capacitor segments.

5. The multi-segment parallel wire capacitor of claim 1, wherein each capacitor segment comprises multiple capacitor elements and each capacitor element comprises two sets of electrically insulated and spatially interleaved parallel metal wire fingers.

6. The multi-segment parallel wire capacitor of claim 5, wherein the metal wire fingers of a first capacitor element has a spatial sequence different from that of an adjacent second capacitor element.

7. The multi-segment parallel wire capacitor of claim 5, wherein a first half of all the sets of parallel metal wire fingers are connected through a first group of metal vias and a second half of all the sets of metal wire fingers are connected through a second group of metal vias.

8. The multi-segment parallel wire capacitor of claim 7, wherein, in a cross-sectional view, each metal wire finger associated with the first half of all the sets of metal wire fingers is adjacent at least one metal wire finger associated with the second half of all the sets of metal wire fingers.

9. The multi-segment parallel wire capacitor of claim 8, wherein all metal wire fingers adjacent a metal wire finger that is associated with the first half of all the sets of metal wire fingers are associated with the second half of all the sets of metal wire fingers.

10. The multi-segment parallel wire capacitor of claim 1, wherein each column of M capacitor segments connected in parallel includes a first terminal and a second terminal, and the first terminal is connected to the first metal line and the second terminal is connected to the second metal line.

11. The multi-segment parallel wire capacitor of claim 1, wherein the first metal line and the second metal are in a same metal layer.

12. The multi-segment parallel wire capacitor of claim 1, wherein the first metal line and the second metal are in two different metal layers.

13. The multi-segment parallel wire capacitor of claim 1, wherein each capacitor segments further includes:
    a first set of metal fingers formed in a first metal layer formed in a dielectric layer on the substrate;
    a second set of metal fingers formed in the first metal layer and interleaved with the metal fingers of the first set, said first set of metal fingers being electrically insulated from said second set of metal fingers;
    a third set of metal fingers formed in a second metal layer located above the first metal layer electrically insulated therefrom;

a fourth set of metal fingers formed in the second metal layer and interleaved with the metal fingers of the third set, said third set of metal fingers being electrically insulated from said fourth set of metal fingers;

the metal fingers of the third set being parallel to and above the metal fingers of the first set and the metal fingers of the fourth set being parallel to and above the metal fingers of the second set; and the first set and fourth set of metal fingers being electrically connected and the second set and third set of metal fingers being electrically connected.

14. The capacitor of claim 13, wherein the first and fourth sets of metal fingers are electrically connected by metal vias.

15. The capacitor of claim 13, wherein the second and third sets of metal fingers are electrically connected by metal vias.

* * * * *